United States Patent
Kim et al.

(10) Patent No.: US 6,853,588 B2
(45) Date of Patent: Feb. 8, 2005

(54) FIRST-IN FIRST-OUT MEMORY CIRCUIT AND METHOD FOR EXECUTING SAME

(75) Inventors: Youngwoo Kim, Seoul (KR); Jae Sung Lee, Daejeon (KR); Kyoung Park, Daejeon (KR); Sang Man Moh, Daejeon (KR); Yong Youn Kim, Daejeon (KR); Myung-Joon Kim, Daejeon (KR); Kee-Wook Rim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 10/631,763

(22) Filed: Aug. 1, 2003

(65) Prior Publication Data

US 2004/0085817 A1 May 6, 2004

(30) Foreign Application Priority Data

Oct. 31, 2002 (KR) .................................. 10-2002-0066844

(51) Int. Cl.$^7$ .............................................. G11C 16/04
(52) U.S. Cl. ............................ 365/189.01; 365/230.02; 365/233; 365/230.06
(58) Field of Search ....................... 365/189.01, 230.02, 365/233, 230.06

(56) References Cited

U.S. PATENT DOCUMENTS

| | | | | |
|---|---|---|---|---|
| 4,839,866 A | * | 6/1989 | Ward et al. | ............ 365/189.01 |
| 5,255,242 A | | 10/1993 | Ward et al. | |
| 5,829,007 A | * | 10/1998 | Wise et al. | ............ 365/230.05 |
| 6,141,721 A | * | 10/2000 | Patterson et al. | ...... 365/230.06 |
| 6,754,746 B1 | * | 6/2004 | Leung et al. | ................ 365/233 |

FOREIGN PATENT DOCUMENTS

| | | | | |
|---|---|---|---|---|
| JP | 06-052677 | 2/1994 | ............ | G11C/7/00 |
| KR | 10-0223626 | 7/1999 | ............ | G11C/7/00 |

* cited by examiner

Primary Examiner—Richard Elms
Assistant Examiner—Tuan T. Nguyen
(74) Attorney, Agent, or Firm—Piper Rudnick LLP

(57) ABSTRACT

In a first-in first-out memory circuit using a standard cell library memory, a memory block includes N number of memories (N>1). A read pointer designates read addresses of the N number of memories. A write pointer designates write addresses of the N number of memories. A memory controller selects one from the N number of memories based on the read/write addresses, generates n number of read/write clock signals by demultiplying a clock signal by n (n=N, n>1) and sends the n number of read/write clock signals having a 1/n cycle difference to the N number of memories thereby inputting/outputting data.

9 Claims, 7 Drawing Sheets

FIRST-IN FIRST-OUT MEMORY CIRCUIT AND METHOD FOR EXECUTING SAME

FIELD OF THE INVENTION

The present invention relates to a first-in first-out memory; and, more particularly, to a first-in first-out memory circuit having an improved input/output speed and a method for executing same.

BACKGROUND OF THE INVENTION

A first-in first-out in a conventional memory refers to a scheme for storing and retrieving data, wherein data primarily stored to the memory are primarily retrieved therefrom.

Hereinafter, a prior art first-in first-out memory circuit is described with reference to accompanying drawings.

FIG. 1 shows a block diagram for illustrating the prior art first-in first-out memory circuit. FIG. 2 illustrates an input/output state of the prior art first-in first-out memory circuit.

As illustrated in FIG. 1, the first-in first-out memory circuit includes a memory 60 of n-bit×m-word, a memory controller 20 for controlling a first-in first-out operation of the memory 60, a read and a write pointer 30 and 40 for designating read and write positions and a flag generator 50.

As illustrated in FIG. 2, when a write signal WR is inputted, the memory controller 20 synchronizes at rising edges of a clock signal Clk to store input data $DI_0$–$DI_{n-1}$ in the memory 60. Further, when a read signal RD is inputted, the memory controller 20 synchronizes at rising edges thereof to sequentially output the stored data.

In other words, when the write signal WR is inputted, the memory controller 20 synchronizes at the rising edges of the clock signal to sequentially record $1^{st}, 2^{nd}, 3^{rd}, \ldots, n^{th}$ input data ($DI_0$–$DI_{n-1}$) in the memory 60. Meanwhile, when the read signal RD is inputted, the memory controller 20 synchronizes at the rising edges thereof to sequentially output the data inputted into the memory 60.

Since the first-in first-out memory circuit has an inner memory of which a width is constructed to be fixed to be a bit width, it is difficult to extend the bit width of input/output data. Further, an operational speed of the first-in first-out memory circuit is limited depending on that of the inner memory, so that the speed is hardly improvable.

As a semiconductor manufacturing technology develops, a size of a transistor becomes smaller. Accordingly, an operational speed of a circuit becomes faster to thereby improve a whole operational speed of the semiconductor. However, the whole operational speed of the semiconductor circuit is limited by the memory speed.

Especially, a memory used in an ASIC circuit employing a standard cell library is manufactured by using a memory compiler. Therefore, a speed of the manufactured memory is much slower than an operational speed of a logic circuit library of a same process. In case a first-in first-out memory used in a system to be designed is required to operate faster than the manufactured memory, a speed of the memory used in the conventional ASIC circuit should be raised by improving a design process, so that design costs of the circuit are increased.

To that end, a plurality of prior arts has been suggested. A first-in first-out memory circuit disclosed in the Korean Patent No. 10-0223626 issued in Jul. 10, 1999 is described as follows.

The first-in first-out memory circuit (DRAMs), which is able to double a bit width, has two memories, a control logic unit, a read and a write pointer, a data distribution unit and a data combination unit. The two memories have the bit width of a byte unit. The control logic unit controls to primarily perform a read/write operation in one memory and then perform a read/write operation in the other memory after the primary memory is used, wherein the two memories correspond to a byte mode and a word mode as well. The read and the write pointer correspond to the byte and the word mode and thus designate addresses to each memory. The data distribution unit and the data combination unit read and write input data in a form corresponding to each mode, respectively.

The data width of the memory in the first-in first-out memory circuit may extend, but a first-in first-out speed on a given process is still limited to an operational speed of an inner memory.

A first-in first-out memory disclosed in Japanese Patent Laid-Open Publication No. 6-52677 is described as follows.

The Japanese Patent provides a method for improving a whole speed of a first-in first-out memory and hardware therefor. Specifically, a high speed of the memory is realized by reducing time intervals of a read signal. The patent uses two shift registers, i.e., an indicator shift register (ISR) and a data shift register (DSR), having a bit width of 8-bit as an inner memory, instead of RAM, and includes an input conversion circuit, an output conversion circuit, an input conversion timing generator and an output conversion timing generator. The first-in first-out memory stores input data into the two shift registers in rotation by a control of the input conversion circuit and outputs the stored data therefrom in rotation by a control of the output conversion circuit.

The first-in first-out memory uses the two shift registers instead of the RAM in order to improve a speed rather than to extend the bit width. However, when the shift registers are used as a storage circuit of data, a design of the memory circuit becomes complicated. Further, a size of the circuit becomes large, so that it is difficult to realize a high capacity circuit of a small size.

While a first-in first-out memory using the RAM can perform a queue operation, a first-in first-out memory having the shift registers cannot perform such queue operation. Besides, primarily inputted data have a delay time corresponding to a depth of the shift registers. As a result, an additional circuit is required to solve the delay time and realize the queue operation.

A sequential memory disclosed in U.S. Pat. No. 5,255,242 uses a plurality of interleaved memory cells to improve an input/output speed of data.

The sequential memory includes two memories having N number of successive storage memory cells of a single bit width, a data access control circuit and an output buffer circuit. The sequential memory generates signals for performing a read/write of data on the memory cells in a predetermined order and at a high speed. Further, the sequential memory controls the output buffer circuit to thereby realize a read/write sequential memory operation at a high speed.

The sequential memory as an inner data storage device uses specialized memory cells and N number of independent memory cell blocks having a single bit width. Therefore, if a plurality of data bit widths are realized, a first-in first-out circuit becomes complicated.

SUMMARY OF THE INVENTION

It is, therefore, an object of the present invention to provide a first-in first-out memory circuit for performing a first-in first-out operation at a high speed by using a plurality of low speed memories and a method for executing same.

In accordance with one aspect of the invention, there is provided a first-in first-out memory circuit using a standard cell library memory, including: a memory block having N number of memories (N>1); a read pointer for designating read addresses of the N number of memories; a write pointer for designating write addresses of the N number of memories; and a memory controller for selecting one from the N number of memories based on the read/write addresses, generating n number of read/write clock signals by demultiplying a clock signal by n (n=N, n>1) and sending the n number of read/write clock signals having a 1/n cycle difference to the N number of memories thereby inputting/outputting data.

In accordance with another aspect of the invention, there is provided an operational method of a first-in first-out memory circuit for performing a first-in first-out operation on N number of memories, including the steps of: (a) generating n number of clock signals by demultiplying a clock signal inputted into the first-in first-out memory circuit by n; (b) inputting read/write addresses from the read/write pointer; (c) selecting one from the N number of memories based on the read/write addresses; (d) sending each of the N number of clock signals to the N number of memories at 1/n cycle difference intervals based on the read/write addresses; and (e) synchronizing at the outputted clock signals and inputting/outputting data.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

There may exist a plurality of preferred embodiments of the present invention, and objects, features and advantages of the present invention will be described in detail through the preferred embodiments with reference to the accompanying drawings.

Figure 1:
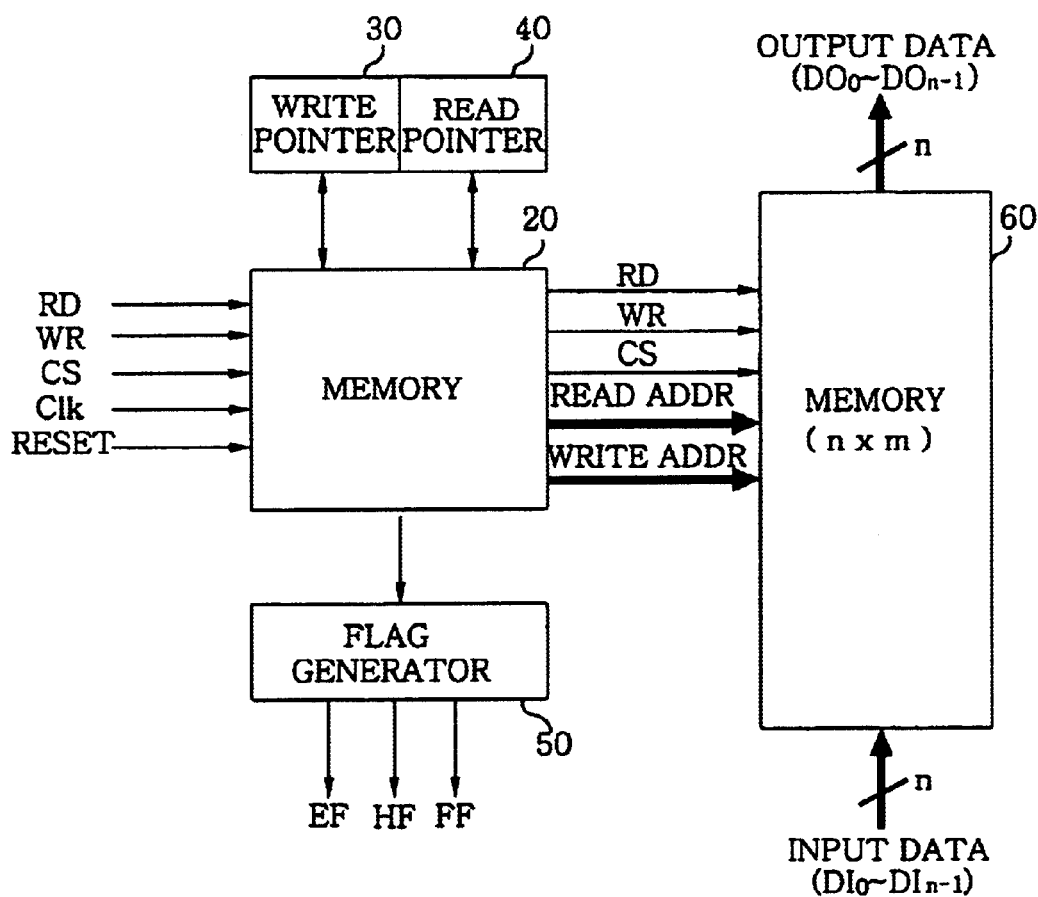
FIG. 1 shows a block diagram for illustrating a prior art first-in first-out memory circuit.
Figure 2:
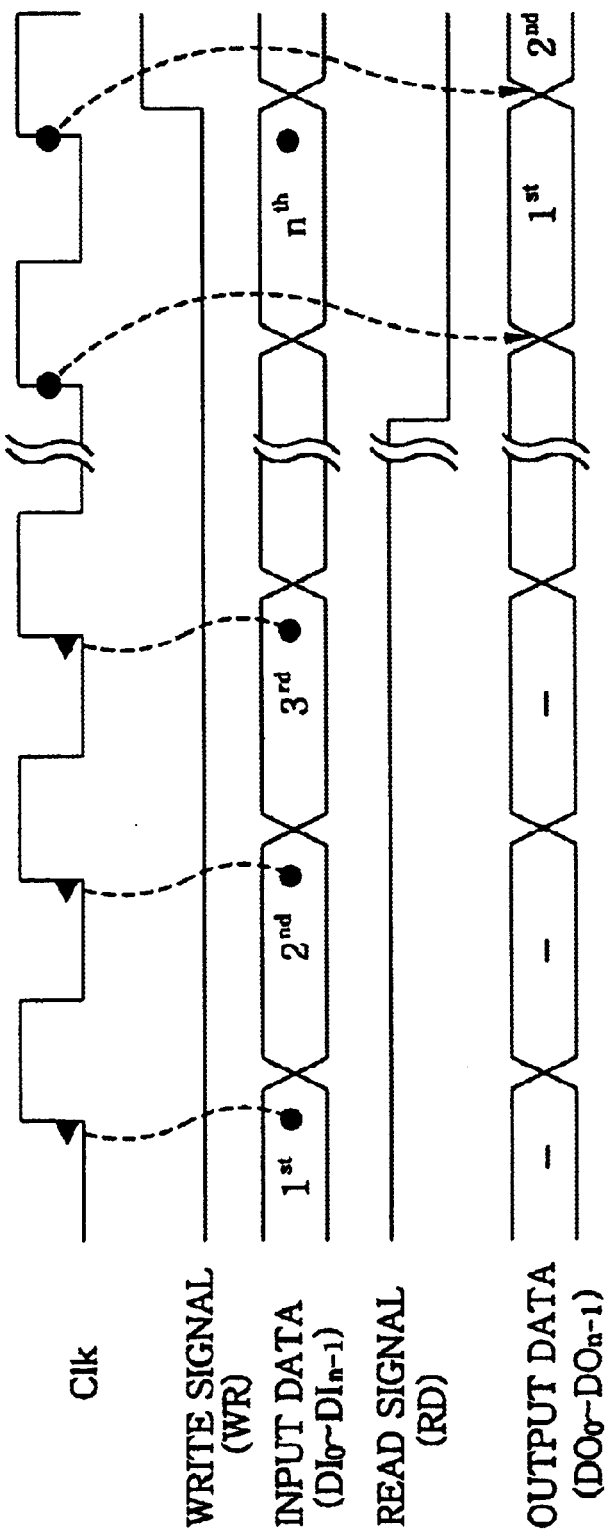
FIG. 2 illustrates an input/output state of the prior art first-in first-out memory circuit.
Figure 3:
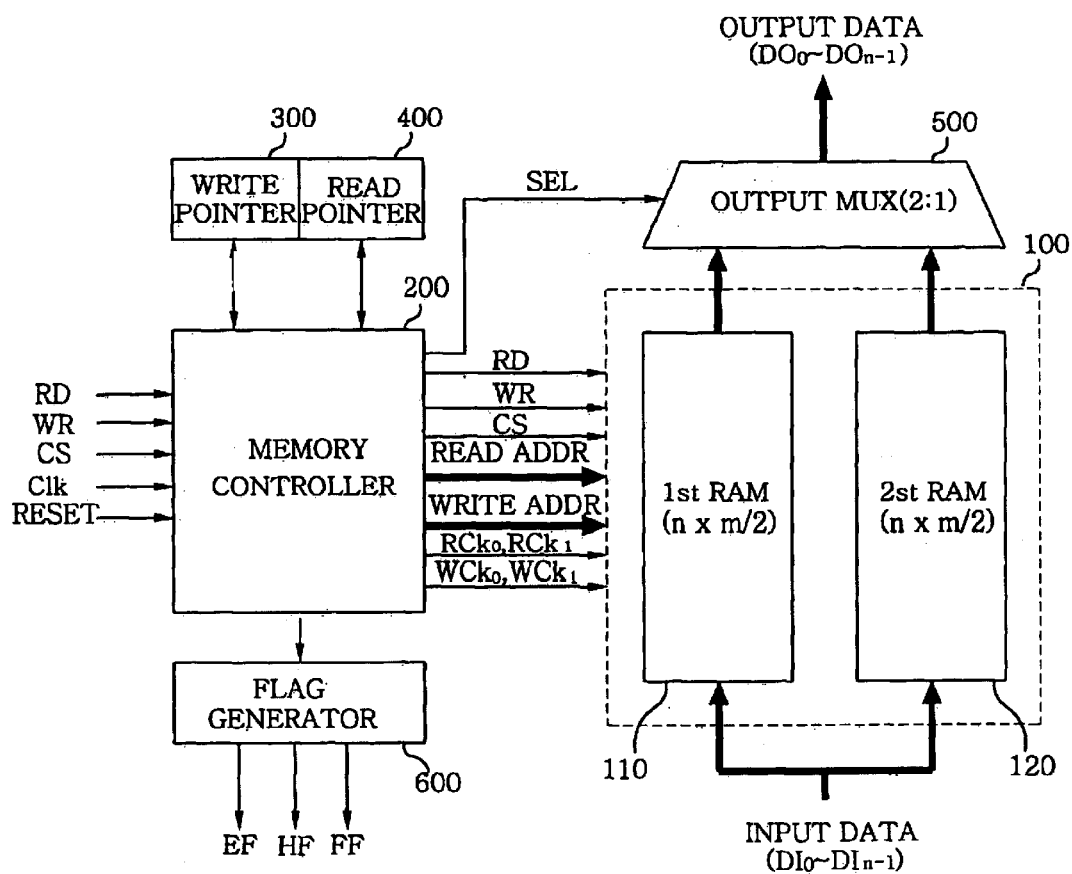
FIG. 3 provides a block diagram for showing a structure of a first-in first-out memory circuit in accordance with a preferred embodiment of the present invention.
Figure 4:
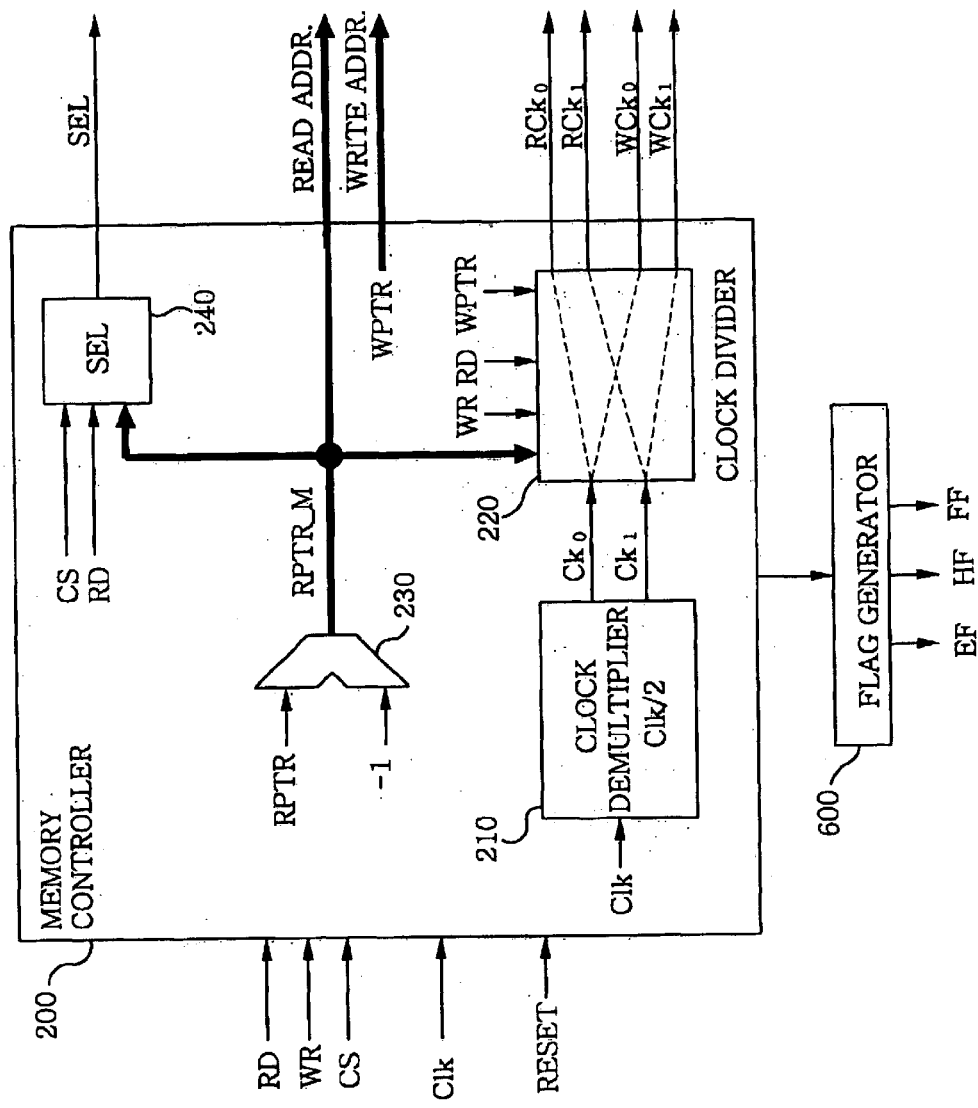
FIG. 4 presents a block diagram for illustrating an inner structure of a memory controller in the first-in first-out memory circuit in accordance with the present invention.
Figure 5:
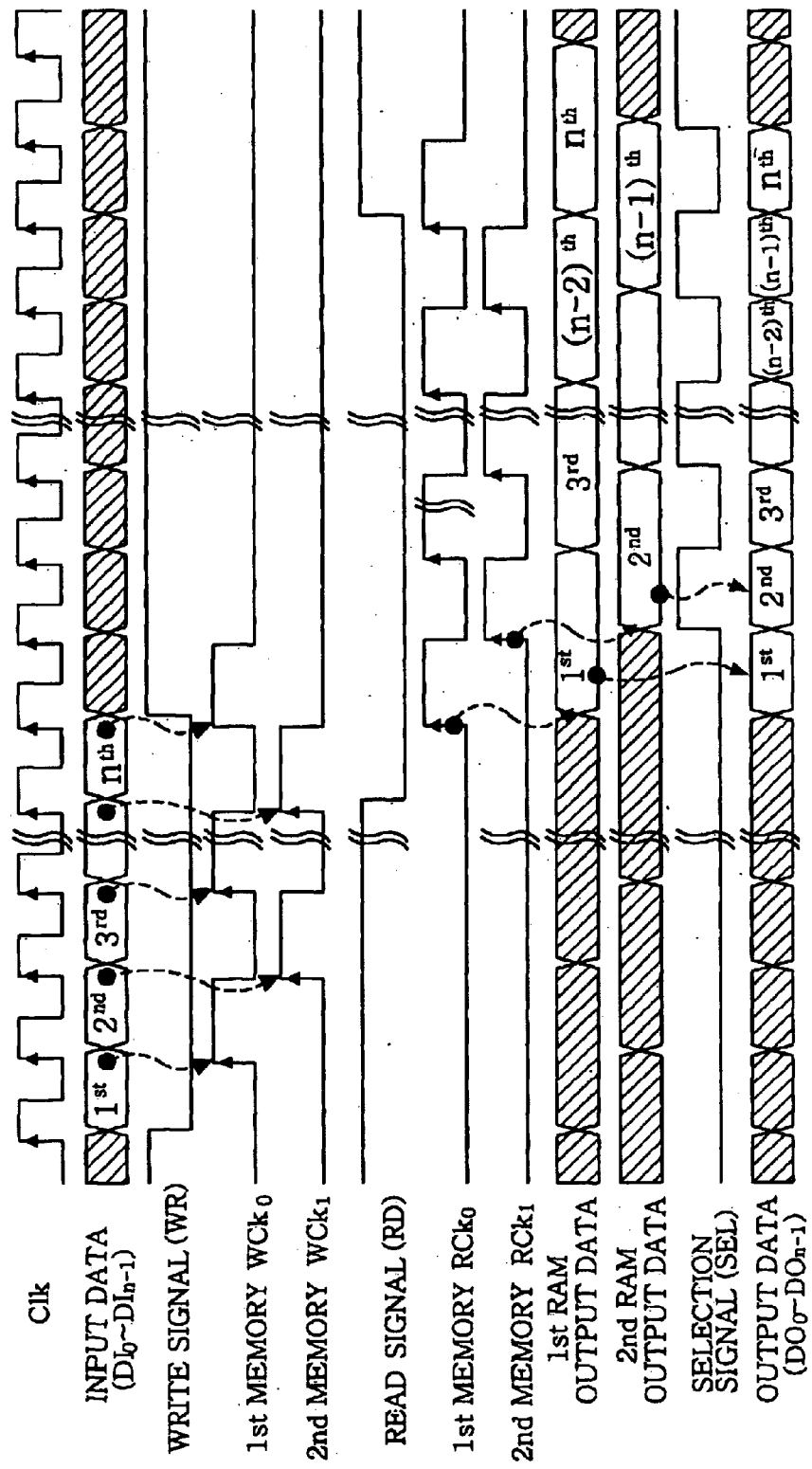
FIG. 5 illustrates a data input/output state of the first-in first-out memory in accordance with the present invention.
Figure 6:
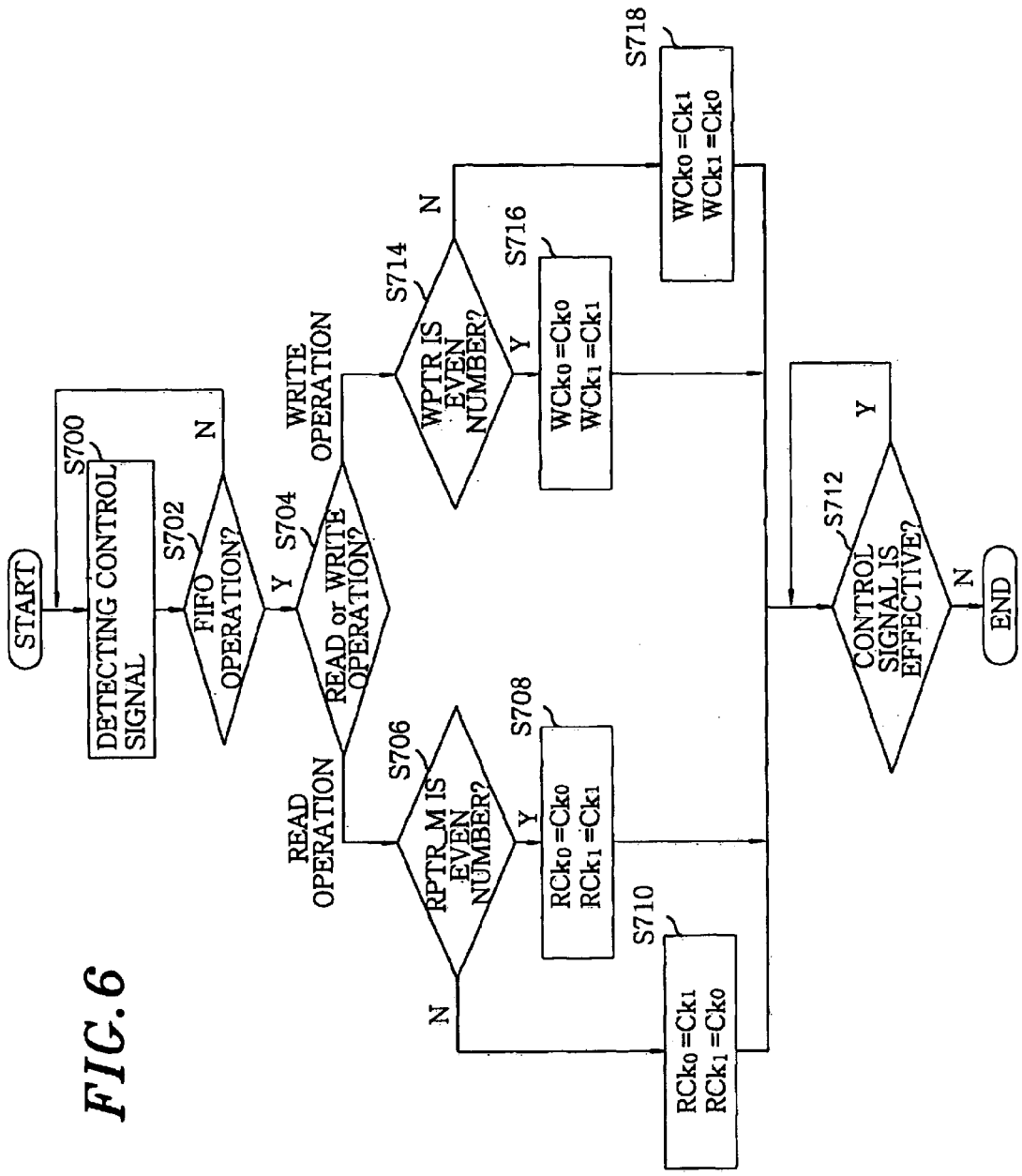
FIG. 6 represents a flow chart for showing a process for dividing clock signals in the first-in first-out memory circuit of the present invention.
Figure 7:
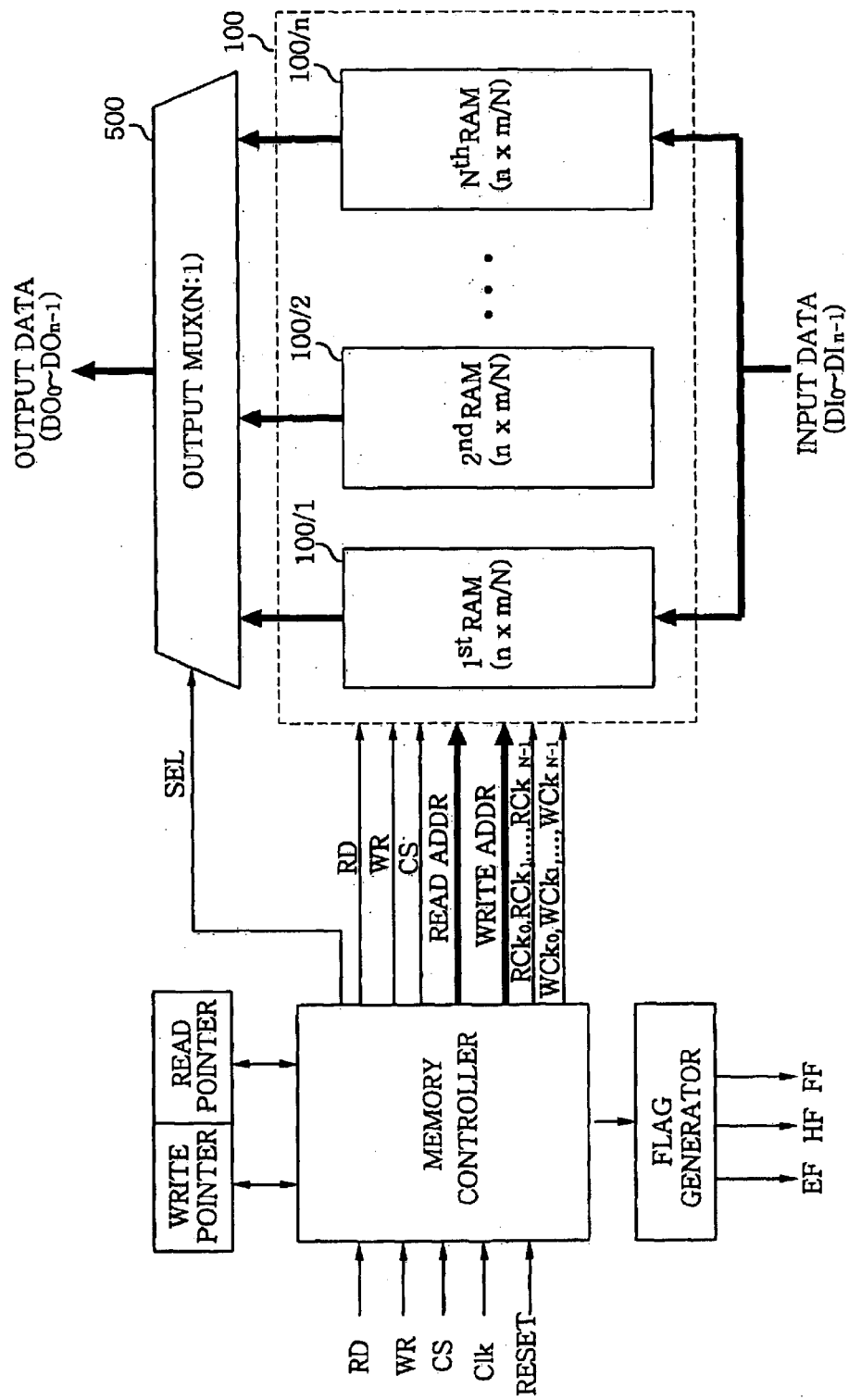
FIG. 7 offers an enlarged example of the first-in first-out memory circuit in accordance with the present invention.

FIG. 3 provides a block diagram for showing a structure of a first-in first-out memory circuit in accordance with a preferred embodiment of the present invention. FIG. 4 presents a block diagram for illustrating an inner structure of a memory controller in the first-in first-out memory circuit in accordance with the present invention. FIG. 5 illustrates a data input/output state of the first-in first-out memory in accordance with the present invention. FIG. 6 represents a flow chart for showing a process for dividing clock signals in the first-in first-out memory circuit of the present invention. FIG. 7 offers an enlarged example of the first-in first-out memory circuit in accordance with the present invention.

As illustrated in FIG. 3, the first-in first-out memory circuit includes a memory block 100, a memory controller 200, a write and a read pointer 300 and 400, an output multiplexer 500 and a flag generator 600.

The memory block 100 comprises a first and a second low speed synchronous memory 110 and 120 that are interleaved, wherein the first and the second memory 110 and 120 are divided into an even address memory and an odd address memory, respectively, by using a least significant bit (LSB) of read/write addresses.

The first and the second memory 110 and 120 synchronize at each of write clock signals provided from the memory controller 200 to store input data, wherein a write clock signal is ahead of another write clock signal by a half cycle. Further, the first and the second memory 110 and 120 synchronize at each of read clock signals to output the stored data, wherein a read clock signal is ahead of another read clock signal by a half cycle. Although the memory block 100 has two memories in a preferred embodiment of the present invention, N number of memories may be used in the memory block 100.

The write pointer 300 designates write addresses of the first and the second memory 110 and 120. The read pointer 400 designates read addresses thereof.

The memory controller 200 selects one between the first and the second memory 110 and 120 based on the read/write addresses outputted from the read and the write pointer 300 and 400 and demultiplies an input clock signal by two thereby generating two read/write clock signals. Further, the memory controller 200 inputs to the first and the second memory 110 and 120 and outputs therefrom the two read/write clock signals having a half cycle difference, so that data can be outputted. Referring to FIG. 5, a specific explanation thereof is described as follows. When the clock signal Clk is inputted into the memory controller 200, two read and two write clock signals ($RCk_0$, $RCk_1$, $WCk_0$ and $WCk_1$) are generated by demultiplying the clock signal by two. Then, data are synchronized at the two read/write clock signal, dependently on an active state thereof and inputted/outputted to the first and the second memory 110 and 120. In this case, since one read/write clock signal is ahead of the other read/write clock signal by a half cycle, data of the second memory 120 are inputted/outputted while data are inputted/outputted in the first memory 110. Next, while the second memory 120 synchronizes at either one between the two read/write clock signals and data are inputted into the second memory 120, the first memory 110 synchronizes at the other read/write clock signal, so that data are inputted into the first memory 110. If a low speed memory is used in the above-described process, an input/output speed of a first-in first-out memory can be improved.

The memory controller 200 selects an odd address memory when an odd address is designated by the read and the write pointer 300 and 400. On the other hand, in case the read and the write pointer 300 and 400 designate an even address, an even address memory is selected. A read/write clock signal for accessing a primarily selected memory is ahead of another read/write clock signal by a half cycle. The cycle difference of the two read/write clock signals can prevent a collision of data and improve the input/output speed.

As illustrated in FIG. 4, the memory controller 200 includes a clock demultiplier 210, a clock divider 220, a subtractor 230 and a selector 240.

The clock demultiplier 210 generates two clock signals ($Ck_0$, $Ck_1$) by demultiplying a clock signal, wherein one read/write clock signal ($Ck_0$) is ahead of another read/write clock signal ($Ck_1$) by a half cycle.

The clock divider 220 divides the two clock signals into read/write clock signals ($RCk_0$, $RCk_1$, $WCk_0$ and $WCk_1$) based on properties, e.g., odd or even, of read/write addresses (RPTR and WPTR) designated by the read and the write pointer 300 and 400 to thereby output the clock signals to the memory block 100. To be specific, in case the read/write addresses are even, the clock divider 220 outputs the read/write clock signals ($RCk_0$ and $WCk_0$) being ahead of the other read/write clock signals ($RCk_1$ and $WCk_1$) by a half cycle to a memory of an even address between the first and the second memory 110 and 120, and the other read/write clock signals ($RCk_1$ and $WCk_1$) to a memory of an odd address. Meanwhile, when the read/write addresses are odd, the clock divider 220 outputs the read/write clock signals ($RCk_0$ and $WCk_0$) being ahead of the read/write clock signals ($RCk_1$ and $WCk_1$) by a half cycle to a memory of an odd address between the first and the second memory 110 and 120 and other read/write clock signals ($RCk_1$ and $WCk_1$) to a memory of an even address.

The subtractor 230 subtracts "1" from a read address value (RPTR) designated by the read pointer 400 in order to avoid a delay of initial time due to a low speed memory when data are outputted from a memory. Next, the calculated address (RPTR_M) is outputted to the clock divider 220 and the selector 230.

The selector 240 generates a selection signal SEL for selecting one of data outputted from memories in reply to a read signal RD, a control signal CS and the subtracted read address (RPTR_M) to thereby provide the selection signal to the output multiplexer 500.

The output multiplexer 500 selects one of data outputted from the first and the second memory 110 and 120 based on the read clock signals ($RCk_0$ and $RCk_1$) in response to the selection signal. In other words, data in the clock signal of one cycle are outputted from the first and the second memory 110 and 120 in accordance with the read clock signals ($RCk_0$ and $RCk_1$). In this case, the output multiplexer 500 outputs data of a half cycle from data of one cycle outputted from a memory selected by the selection signal, e.g., the first memory. Then, data of a half cycle are outputted from data of one cycle outputted from the other memory, e.g., the second memory.

Referring to FIG. 6, there described a process for dividing clock signals when a read/write operation is performed in a first-in first-out memory.

The clock divider 220 determines whether a first-in first-out operation is performed in a first-in first-out memory circuit by checking a control signal (steps S700 and S702). As the check result of the step S702, if the first-in first-out operation has been performed, the clock divider 220 uses the read RD and the write WR signals to determine whether the operation of the circuit corresponds to a read or write operation (step S704). If otherwise, it is checked whether the control signal is inputted or not by returning back to the step S700.

As the check result of the step S704, if the read signal is inputted, the clock divider 220 checks whether a read address value (RPTR_M) inputted through the subtractor 230 is an even number (step S706) As the check result of the step S706, if it is the even number, the clock divider 220 sends a clock signal ($Ck_0$) of which cycle is ahead of another clock signal by ½ between two clock signals outputted from the clock demultiplier 210 to the read clock signal ($RCk_0$) of the first memory 110 and another clock signal ($Ck_1$) to the read clock signal ($RCk_1$) of the second memory 120 (step S708).

As the check result of the step S706, if the read address value (RPTR_M) is an odd number, the clock divider 220 sends a clock signal ($Ck_0$) of which cycle is ahead of another clock signal by ½ between two clock signals outputted from the clock demultiplier 210 to the read clock signal ($RCk_1$) of the second memory 120 and another clock signal ($Ck_1$) to the read clock signal ($RCk_0$) of the first memory 110 (step S710).

After it is checked whether the control signal is valid or not, if the control signal is not inputted, the clock divider 220 completes the operation for dividing the clock signals (step S712).

As the check result of the step S704, if the write signal is inputted, the clock divider 220 checks whether a write address value (WPTR) inputted by the write pointer 300 is an even number (step S714). As the check result of the step S714, if it is an even number, the clock divider 220 sends a clock signal ($Ck_0$) of which cycle is ahead of another clock signal by ½ between the two clock signals outputted from the clock demultiplier 210 to the write clock signal ($WCk_0$) of the first memory 110 and another clock signal ($Ck_1$) to the write clock signal ($WCk_1$) of the second memory 120 (step S716).

As the check result of the step S714, if the write address value (WPTR) is an odd number, the clock divider 220 sends a clock signal ($Ck_0$) of which cycle is ahead of another clock signal by ½ between the two clock signals outputted from the clock demultiplier 210 to the write clock signal ($WCk_1$) of the second memory 120 and another clock signal ($Ck_1$) to the write clock signal ($WCk_0$) of the first memory 110 (step S718).

Thereafter, the clock divider 220 proceeds to the step S712 to check whether the control signal is valid or not. If the control signal is not inputted, an operation for dividing the clock signals is completed.

The flag generator 600 generates signals based on a memory state of the memory block 100. Specifically, when the memory is empty, an EF signal is generated. On the other hand, when the memory is full, a FF signal is generated. When the memory is half full, a HF signal is generated.

In accordance with the present invention, the memory block 100 includes two interleaved memories to obtain a first-in first-out speed corresponding to a double operational speed of a memory. However, as illustrated in FIG. 7, if a memory block includes of N number of interleaved RAMs (100/1, 100/2, ..., 100/n) or memories, the first-in first-out speed can be enhanced as N times thereof.

In this case, the output multiplexer selects one from data outputted from the N number of memories. The memory controller 200 selects one RAM from the N number of RAMs based on read/write addresses and generates n number of read/write clock signals by demultiplying a clock signal by n (n=N, n>1). Then, each of the n number of read/write clock signals is outputted to the n number of RAMs at 1/n cycle intervals, to thereby input/output data.

In other words, the clock demultiplier of the memory controller generates n number of clock signals (n=N, n>1)

The clock divider generates n number of read/write clock signals by using the n number of clock signals based on the read/write address, wherein the n number of read/write clock signals synchronize a selected RAM and other RAMs at 1/n cycle intervals.

The present invention uses a memory manufactured by a low speed memory processing for a first-in first-out memory of a high speed. Thus, an ineffectiveness of the first-in first-out memory due to a speed difference between a memory and a general logic circuit can be removed. Further, by using a simple and effective control circuit, time and costs for a designation and a modification of a first-in first-out memory circuit can be minimized.

While the invention has been shown and described with respect to the preferred embodiments, it will be understood by those skilled in the art that various changes and modifications may be made without departing from the spirit and scope of the invention as defined in the following claims.

What is claimed is:

1. A first-in first-out memory circuit using a standard cell library memory, comprising:
    a memory block having N number of memories (N>1);
    a read pointer for designating read addresses of the N number of memories;
    a write pointer for designating write addresses of the N number of memories; and
    a memory controller for selecting one from the N number of memories based on the read/write addresses, generating n number of read/write clock signals by demultiplying a clock signal by n (n=N, n>1) and sending the n number of read/write clock signals having a 1/n cycle difference to the N number of memories thereby inputting/outputting data.

2. The first-in first-out memory circuit of claim 1, wherein the memory controller includes:
    a clock demultiplier for generating n number of clock signals by demultiplying the clock signal by n;
    a clock divider for dividing the n number of clock signals into n number of read/write clock signals based on the addresses;
    a subtractor for subtracting a predetermined value from a read address value; and
    a selector for outputting a selection signal for selecting one from data outputted from memories based on the read clock signals.

3. The first-in first-out memory circuit of claim 2, wherein the first-in first-out memory circuit further comprises an output multiplexer for selecting one from data outputted from the memory block and outputting the selected data in reply to the selection signal.

4. The first-in first-out memory circuit of claim 2, wherein the n number of clock signals have a 1/n cycle difference.

5. The first-in first-out memory circuit of claim 2, wherein the subtractor subtracts "1" from the read address value and outputs the subtracted value.

6. The first-in first-out memory circuit of claim 2, wherein the clock divider sends n number of clock signals generated by the clock demultiplier based on the read/write address values to interleaved memories of a memory block.

7. The first-in first-out memory circuit of claim 1, wherein the memory block includes N number of synchronous memories interleaved with at least one even address memory and odd address memory and selects each memory by using a least significant bit of the read/write addresses.

8. An operational method of a first-in first-out memory circuit for performing a first-in first-out operation on N number of memories, comprising the steps of:
    (a) generating n number of clock signals by demultiplying a clock signal inputted into the first-in first-out memory circuit by n;
    (b) inputting read/write addresses from the read/write pointer;
    (c) selecting one from the N number of memories based on the read/write addresses;
    (d) sending each of the N number of clock signals to the N number of memories at 1/n cycle difference intervals based on the read/write addresses; and
    (e) synchronizing at the outputted clock signals and inputting/outputting data.

9. The method of claim 8, wherein the read operation of the first-in first-out memory circuit is performed in such a manner that the read address value is reduced to a predetermined value and each of the n number of clock signals is sent to the N number of memories by using the reduced address value.

* * * * *